(12) United States Patent
Chiu et al.

(10) Patent No.: US 8,403,143 B2
(45) Date of Patent: Mar. 26, 2013

(54) RETICLE STORING CONTAINER

(75) Inventors: Ming-Chien Chiu, Tucheng (TW); Pao-Yi Lu, Tucheng (TW); Chin-Ming Lin, Tucheng (TW); Chen-Wei Ku, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 147 days.

(21) Appl. No.: 12/915,274

(22) Filed: Oct. 29, 2010

(65) Prior Publication Data

US 2012/0037522 A1    Feb. 16, 2012

(30) Foreign Application Priority Data

Aug. 12, 2010 (TW) .............................. 99126918 A

(51) Int. Cl.
*B65D 85/48* (2006.01)
(52) U.S. Cl. .................. 206/454; 206/710; 206/724
(58) Field of Classification Search .................. 206/454, 206/455, 710, 724
See application file for complete search history.

(56) References Cited

U.S. PATENT DOCUMENTS

| | | | |
|---|---|---|---|
| 6,197,454 B1 | 3/2001 | Yan | |
| 6,280,886 B1 | 8/2001 | Yan | |
| 6,492,067 B1 | 12/2002 | Klebanoff et al. | |
| 6,630,988 B2 | 10/2003 | Greene, Jr. et al. | |
| 6,646,720 B2 | 11/2003 | Ramamoorthy et al. | |
| 6,734,445 B2 | 5/2004 | Ramamoorthy et al. | |
| 6,906,783 B2 | 6/2005 | del Puerto et al. | |
| 7,102,127 B2 | 9/2006 | Ramamoorthy et al. | |
| 7,159,719 B2 | 1/2007 | Golda | |
| 7,209,220 B2 | 4/2007 | Puerto et al. | |
| 7,259,835 B2 | 8/2007 | Matsutori et al. | |
| 7,304,720 B2 | 12/2007 | del Puerto et al. | |
| 7,400,383 B2 | 7/2008 | Halbmaier et al. | |
| 7,420,655 B2 | 9/2008 | Matsutori et al. | |
| 7,450,219 B2 | 11/2008 | Matsutori et al. | |
| 7,477,358 B2 | 1/2009 | Phillips et al. | |
| 7,528,936 B2* | 5/2009 | Gregerson et al. | 355/72 |
| 7,607,543 B2* | 10/2009 | Gregerson et al. | 206/710 |
| 2007/0084743 A1* | 4/2007 | Chu | 206/455 |
| 2007/0258061 A1 | 11/2007 | Puerto et al. | |
| 2009/0027639 A1* | 1/2009 | Phillips et al. | 355/30 |
| 2009/0114563 A1* | 5/2009 | Yeh | 206/710 |
| 2009/0297303 A1* | 12/2009 | Hyobu et al. | 414/269 |
| 2009/0301917 A1* | 12/2009 | Kolbow et al. | 206/454 |
| 2010/0051501 A1* | 3/2010 | Corbin et al. | 206/710 |

\* cited by examiner

Primary Examiner — Luan K Bui
Assistant Examiner — Rafael Ortiz
(74) Attorney, Agent, or Firm — Ming Chow; Sinorica, LLC

(57) ABSTRACT

A reticle storing container is disclosed to include an outer container, an inner container, and a purging valve. The outer container comprises a container body and a container base on which at least a first through-hole is disposed, and a first inner space is formed between the container body and the container base for storing the inner container. The inner container comprises a top cover and a bottom base on which at least a second through-hole connected to the first through-hole is disposed, and a second inner space is formed between the top cover and the bottom base for storing a reticle. The purging valve is disposed in the first through-hole on the outer container base and connected to the second through-hole of said inner container, wherein the purging valve comprises a spring and a valve part. Thus, when the valve part is propped up by a purging head, the valve part compresses the spring for the purging valve to be connected to the purging head. And a filter material is disposed on the joint portion between the container body and the container base to prevent the interior of the reticle from being contaminated.

7 Claims, 21 Drawing Sheets

RETICLE STORING CONTAINER

BACKGROUND OF THE INVENTION

1. Field of the Invention

The present invention is related to a reticle storing container, and more particularly, to a reticle storing container used in the EUV lithography process.

2. Description of the Prior Art

In the rapidly developing modern semiconductor technology, optical lithography tool plays an important role. The pattern definition relies fully on optical lithography technology. In the application of optical lithography tool related to semiconductors, pre-designed circuit paths are fabricated as light-transparent reticle in specific form. Basing on the principle of exposure, after light from the light source passes through the reticle and is projected on a silicon wafer, specific circuit pattern can be exposed on the silicon wafer. However, since any kind of dust (such as particles, powders, and organic matters) adhering to the reticle can cause degradation of the quality of the projected pattern, the reticle used to produce pattern on silicon wafers is required to be kept absolutely clean. Therefore in ordinary wafer processes, clean rooms are provided for preventing from contamination caused by particles in the air. However, the status of absolute dustless is still inaccessible in clean rooms at present. In current semiconductor processes, anti-contamination reticle pods are used for storing and transporting reticles to ensure the cleanliness of reticles.

In recent years, in order to further scale down the chip feature sizes, EUV (extreme ultraviolet light) at a wavelength of 157 nm is applied in lithography tool for the pattern on reticle to be imaged with higher resolution when being projected on the surface of a silicon wafer. However, when EUV is applied, the requirements for cleanliness of reticle pod are also, relatively speaking, higher. Particles smaller than 30 micrometers are previously acceptable, but as far as reticle pods for use with EUV lithography techniques are concerned, only particles with sizes between 30 and 50 micrometers are acceptable.

Then, referring to FIG. 1, which is a container for reticle transportation used in EUV lithography process of the prior art. At least one reticle pod 81 is disposed in the container for reticle transportation 80, and the reticle pod 81 is purged with clean gas and accommodates a reticle R. Moreover, the container for reticle transportation 80 includes a thermophoretic source 82, dry ice for example. The temperature of the side 81A of the reticle pod 81 that is close to the thermophoretic source 82 is lower, and therefore particles in the reticle pod 81 can be driven to move toward or gather on the side 81A that is close to the thermophoretic source and will not adhere to the surface of the reticle R. With the aforementioned container for reticle transportation 80, it seems that the particles can be controlled. However, if the thermophoretic source 82 is used to drive particles away from the reticle R, then the particles that are originally located above the reticle R may then adhere onto the reticle R. Therefore, a container for reticle transportation to be used in EUV lithography process is still urgently needed.

SUMMARY OF THE INVENTION

In view of the problems of the container for reticle transportation of the prior art that particles are not effectively controlled and that an extra thermophoretic source is needed, one primary objective of the present invention is thus to provide a reticle storing container, which is suitable for being used to transport reticles in EUV lithography process and in which size of particles in the reticle storing container can be effectively reduced without any thermophoretic source.

According to the above-mentioned objective, the present invention first provides a reticle storing container, which comprises an outer container, an inner container, and a purging valve. The outer container comprises a container body and a container base on which at least a first through-hole is disposed, and a first inner space is formed between the container body and the container base for storing the inner container. The inner container comprises a top cover and a bottom base on which at least a second through-hole connected to the first through-hole is disposed, and a second inner space is formed between the top cover and the bottom base for storing a reticle. The purging valve is disposed in the first through-hole on the outer container base and comprises a spring and a valve part. When the valve part is propped up by a purging head, the valve part compresses the spring for the purging valve to be connected to the purging head.

In the reticle storing container of the present invention, the particles can be reduced by two methods, filling the reticle storing container with clean gas by a purging head, or exhausting the gas in the reticle storing container by a vacuum pump.

DETAIL DESCRIPTION OF THE PREFERRED EMBODIMENTS

In order to disclose technologies employed in, objectives of, and effects achieved by the present invention in a more complete and clearer way, the present invention is thus described in detail in the following, and drawings and signs are also referred to for further illustrating characteristics of the present invention.

Figure 1:
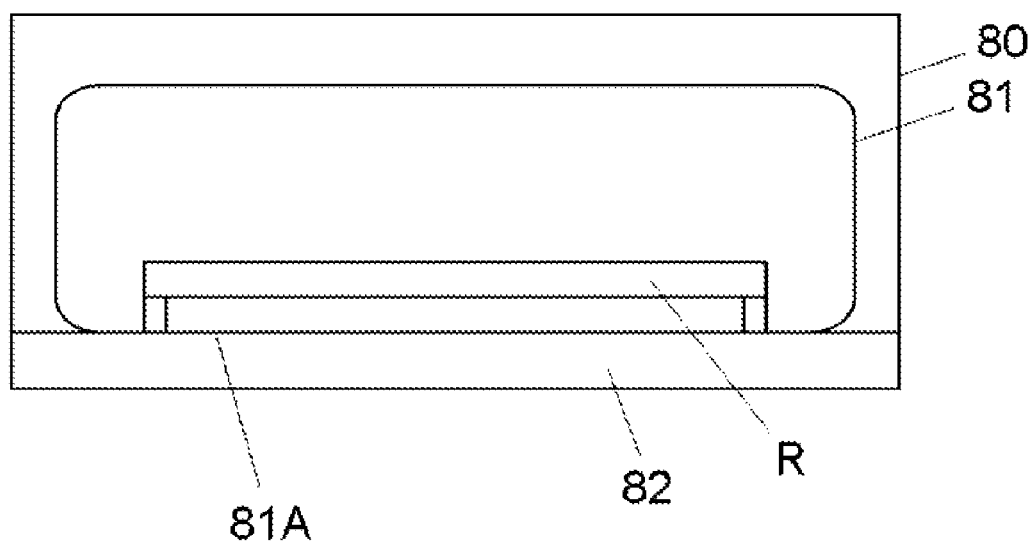
FIG. 1 is a container for transportation for use in EUV lithography process of the prior art.
Figure 2:
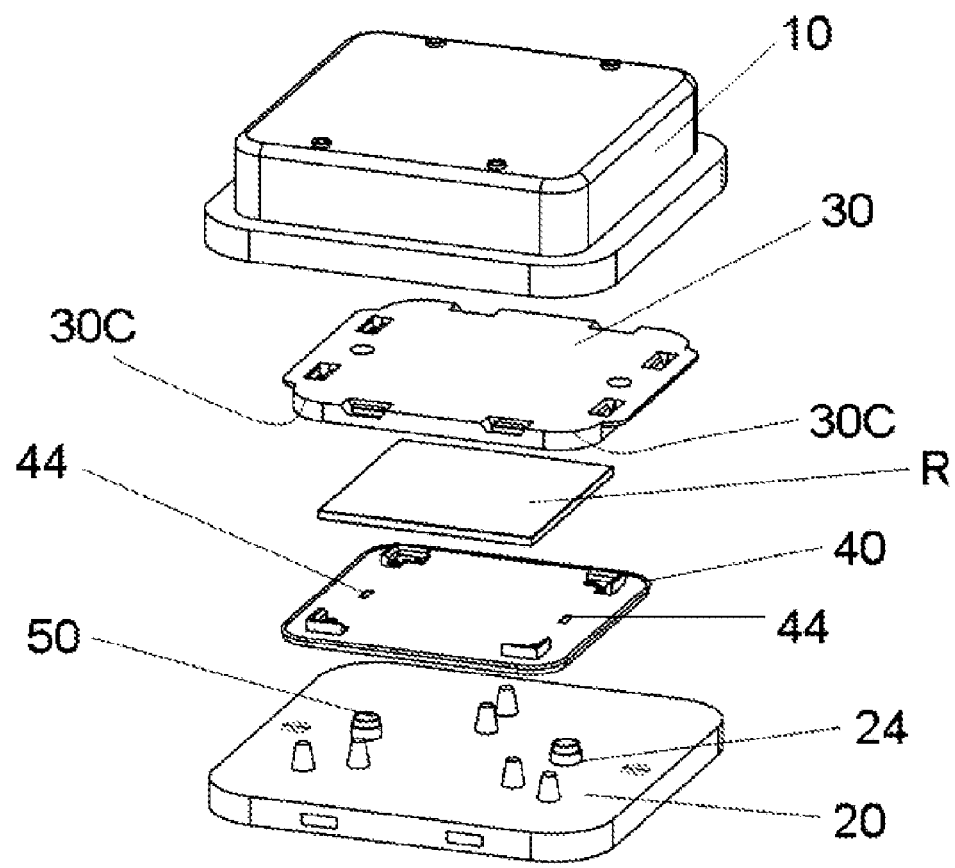
FIG. 2 is a view of a reticle storing container of the present invention.

First, referring to FIG. 2, which is a view of a reticle storing container of the present invention. The reticle storing container comprises an outer container, an inner container, and a purging valve 50. The outer container comprises a container body 10 and a container base 20, and a first inner space is formed between the container body 10 and the container base 20 for storing the inner container. The inner container comprises a top cover 30 and a bottom base 40, and a second inner space is formed between the top cover 30 and the bottom base 40 for storing a reticle R. At least a first through-hole 24 is disposed on the aforementioned container base 20, and at least a second through-hole 44 connecting to the first through-hole 24 is disposed on the bottom base 40. The purging valve 50 is disposed in the first through-hole 24 on the container base 20 so that a purging head can purge the inner container of the reticle storing container via the first through-hole 24 and the second through-hole 44. Moreover, a buffer material (not shown in Figure) is disposed at the contact area between the first through-hole 24 and the second through-hole 44 to enhance the effect of air-tightness. The material of the aforementioned container body 10, container base 20, top cover 30, and bottom base 40 can be metal so that the static electricity can be screened and generation of volatile gases or dust particles can be reduced.

Figure 3:
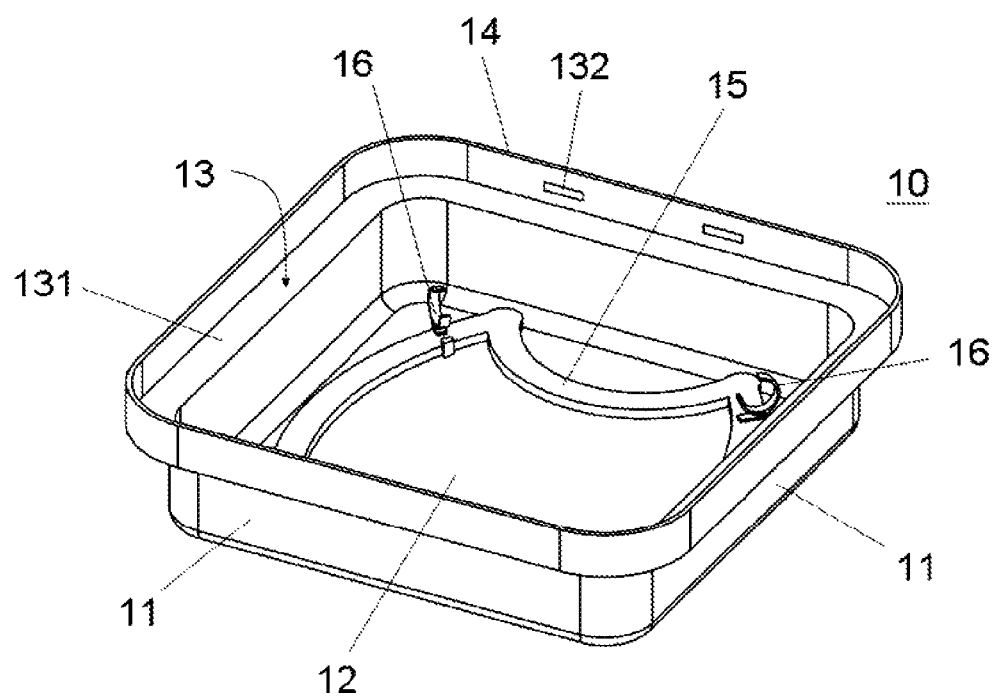
FIG. 3 is a view of the interior of container body of the reticle storing container of the present invention.
Figure 4:
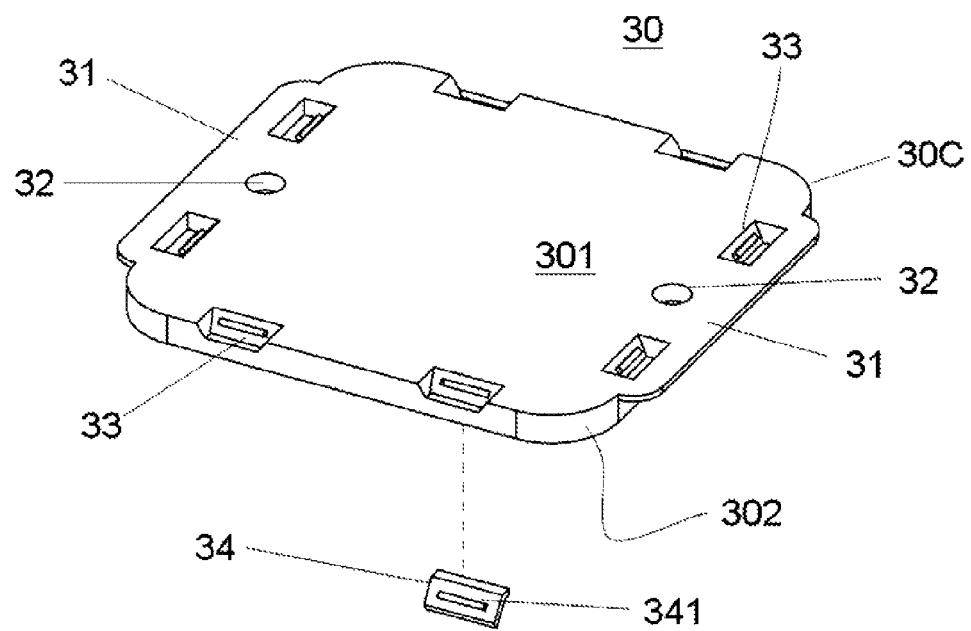
FIG. 4 is a top view of the top cover of the reticle storing container of the present invention.
Figure 5:
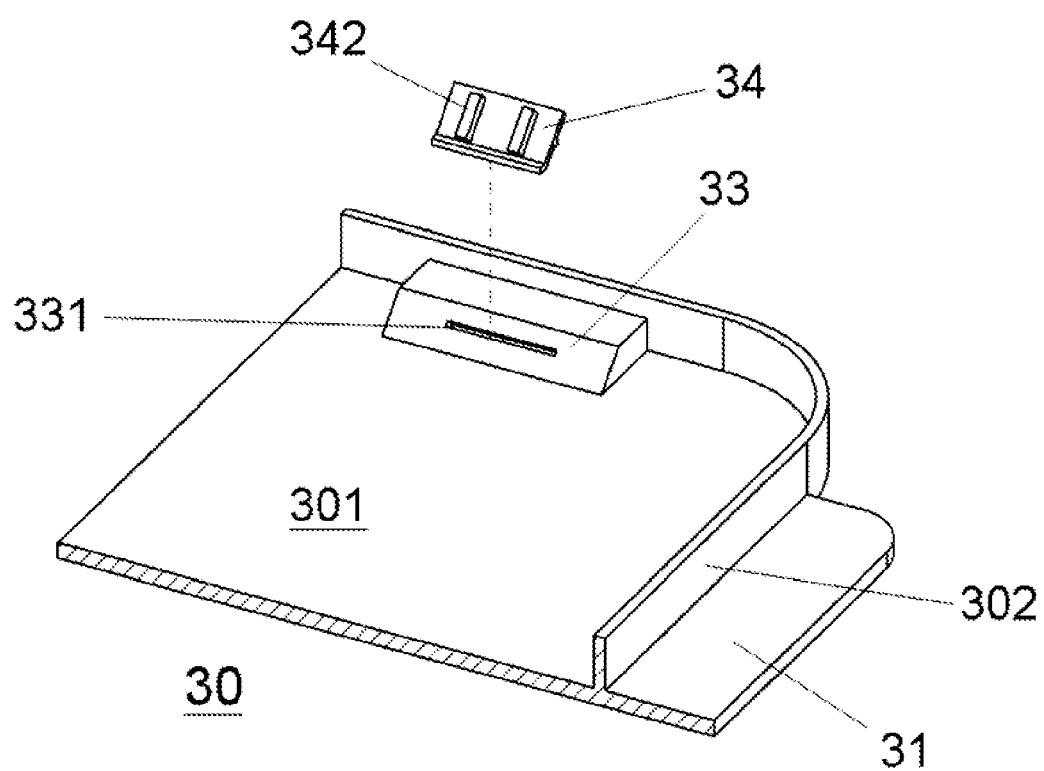
FIG. 5 is a view of the interior of the top cover of the reticle storing container of the present invention.

FIG. 3 is a view of the interior of the container body 10 of reticle storing container of the present invention. FIG. 4 is a top view of the top cover 30 of reticle storing container of the present invention. FIG. 5 is a view of the interior of the top cover 30 of reticle storing container of the present invention. As shown in FIG. 3, the container body 10 is composed of four sidewalls 11 and an enclosed top 12 on one end of the four sidewalls 11, and a container base reception portion 13 first extends outward from another end of the four sidewalls 11 and then forms an opening 14. The container base reception portion 13 includes a platform 131 for being propped against by the container base 20, and a plurality of recesses 132 are disposed on the sidewall near the opening 14 for the lock-fastening device (not shown in Figure) of the container base 20 to be embedded in. In addition, a fastening rib 15 is disposed on the inner surface of the enclosed top 12 with a distance kept in-between, and a sustaining piece 16 is further respectively disposed on the fastening rib 15 near each of the four corners of the container body 10. The sustaining pieces 16 have a hook-like supporting portion that can press the four corners 30C (as shown in FIG. 2 and FIG. 4) of the top cover 30 for fastening the inner container in the first inner space formed between the container body 10 and the container base 20.

Referring to FIG. 4 and FIG. 5, the top cover 30 has an upper surface 301 and protruding grips 31 extending from two sides for the top cover 30 to be raised by robotic arms. The sidewall 302 extends vertically downward from the upper surface 301 and an inner space is formed in-between; when the top cover 30 and the bottom base 40 are joined, a second inner space as previously described can be formed. Moreover, two upper supporting piece mounting portions 33 are respectively disposed near four rims on the upper surface 301, and a through-hole 32 is respectively disposed between the upper supporting piece mounting portions 33 near the two protruding grips 31. The upper supporting piece mounting portion 33 is a cavity on the upper surface 301 indenting toward the interior of the top cover 30 and forms a bevel at about 45 degrees with the upper surface 301. The aforementioned upper supporting piece mounting portion 33 includes a mounting gap 331 for a mounting rib 341 on the rear surface of an upper supporting piece 34 to be embedded in. And two protruding ribs 342 are further disposed on the front of the upper supporting piece 34 for propping against the upper crest line of the reticle. The material of upper supporting piece 34 can be high polymer material or high wear-resistant high polymer material, PEEK for example, to reduce friction against the reticle, and the material of the top cover 30 can be the same as or different from that of the upper supporting piece 34, which is not limited in the present invention.

Figure 6:
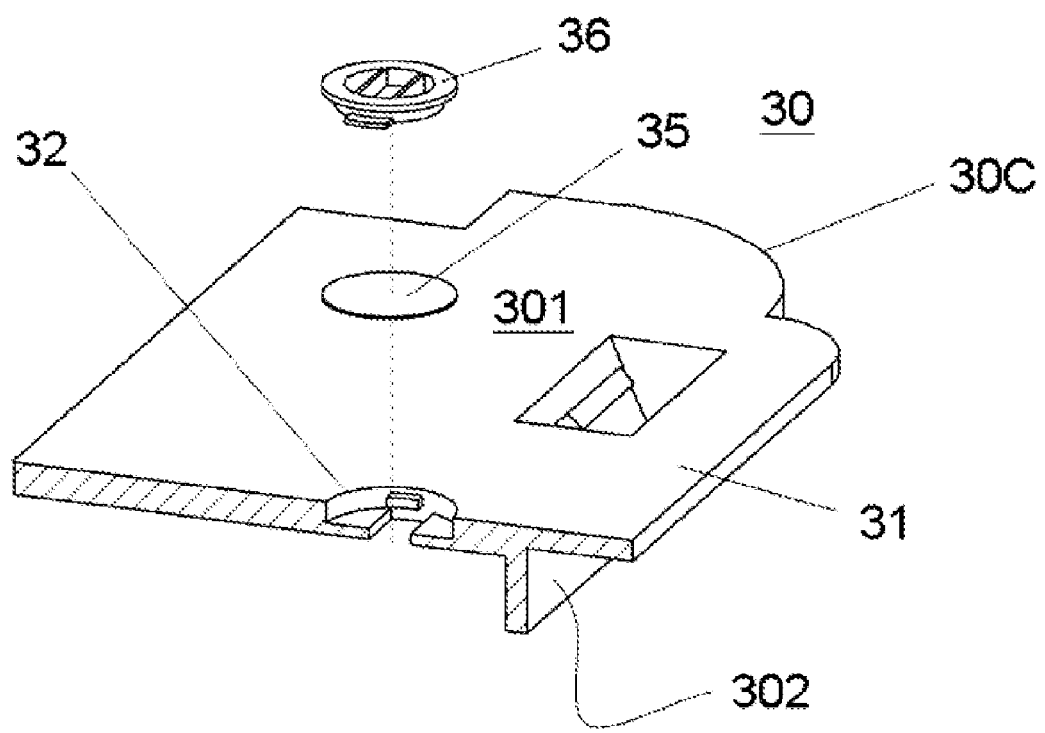
FIG. 6 is a partial top view of the top cover of the reticle storing container of the present invention.

As shown in FIG. 6, a filter piece 35 is disposed in the interior of the through-hole 32 of the upper surface 301, wherein the filter piece 35 is fixedly disposed in the through-hole 32 via a fastening piece 36. Both the fastening piece 36 and the through-hole 32 respectively include snap-fits. Therefore, when the fastening piece 36 presses the filter piece 35 downward on the through-hole 32 and rotates certain degree, the snap-fit of the fastening piece 36 is located under the snap-fit on the rim of the through-hole 32 for the fastening piece 36 and the through-hole 32 to be snap-fitted together.

Figure 8A:
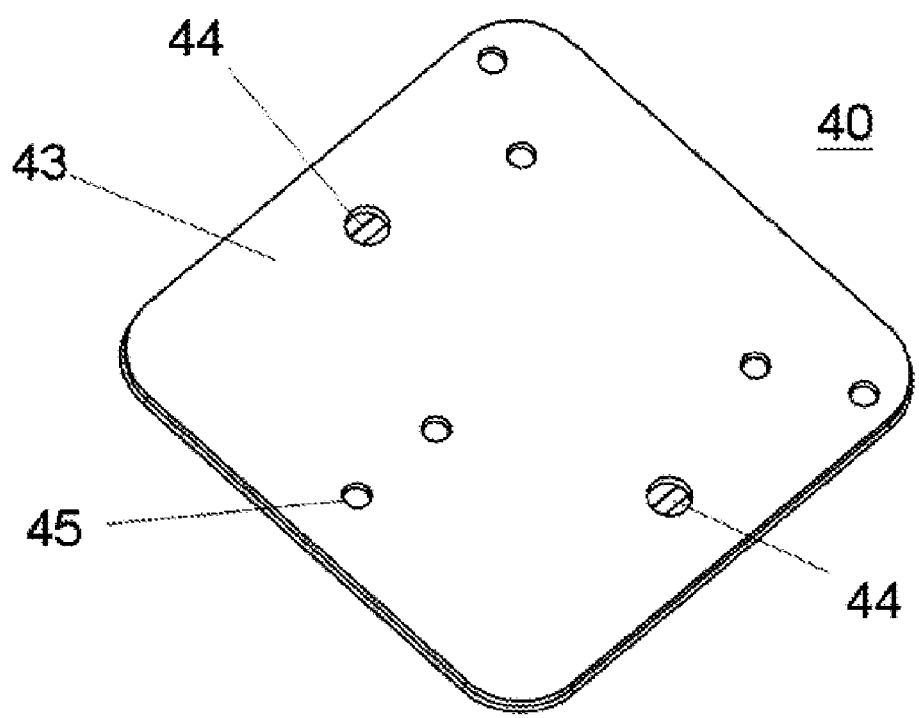
FIG. 8A is a bottom view of the bottom base of the reticle storing container of the present invention.
Figure 8B:
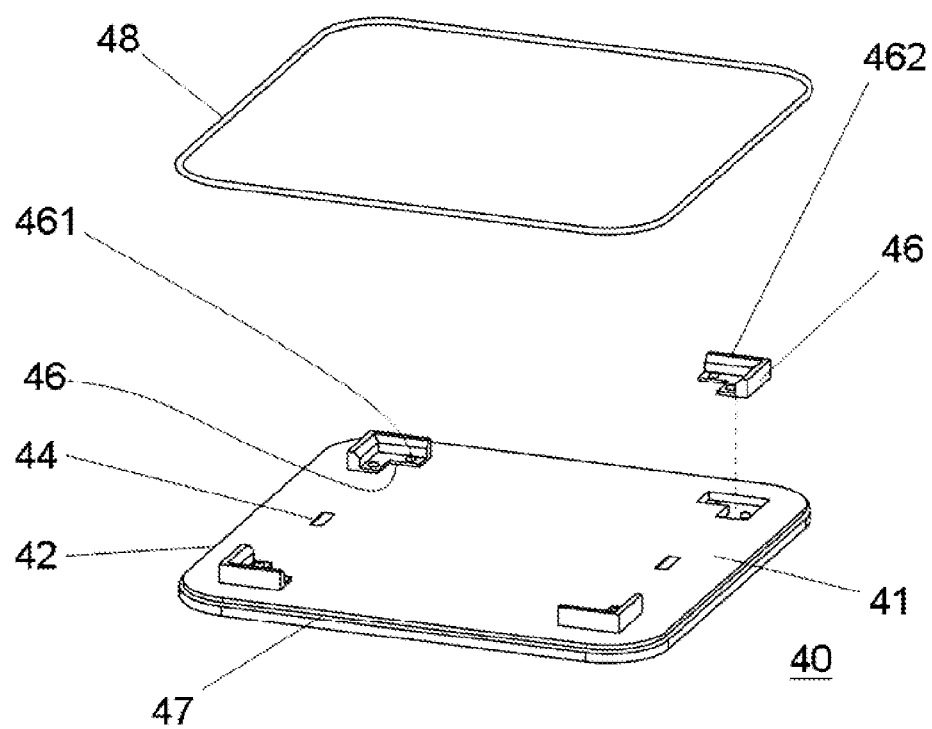
FIG. 8B is a top view of the bottom base of the reticle storing container of the present invention.

Then, referring to FIG. 8A and FIG. 8B, which are respectively a bottom view and a top view of the bottom base 40 of the reticle storing container of the present invention. The bottom base 40 includes an upper surface 41, a side surface 42, and a lower surface 43. As shown in FIG. 8A, positioning cavities 45 are disposed on the lower surface 43 of the bottom base 40 in correspondence to the positioning bolts 25 of the container base 20 for the bottom base 40 to be securely fastened to the container base 20. The number of the positioning cavities 45, like the number of the positioning bolts 25, is also a multiple of three (such as 3, 6, 9, etc.), which is not limited in the present invention. And a second through-hole 44 is disposed on the bottom base 40 in correspondence to the first through-hole 24 of the container base 20 and connects the upper surface 41 and the lower surface 43 of the bottom base 40. A lower supporting piece 46 is respectively lock-fastened on the upper surface 41 of the bottom base 40 near the four corners. Each of the lower supporting pieces 46 includes two reticle supporting points 461 and a guiding sidewall 462 is further disposed on the circumference of the supporting points 461. The supporting points 461 are semi-circular protruding points that greatly reduce the area in contact with the reticle. And the guiding sidewall 462 guides the reticle above the reticle supporting points 461 and restricts the reticle between the guiding sidewall 462. The material of lower supporting piece 46 can be high polymer material or high wear-resistant high polymer material such as PEEK to reduce friction against the reticle; the material of the bottom base 40 can be the same as or different from the material of the lower supporting piece 46, which is not limited in the present invention. A trough 47 is disposed at the rim of the upper surface 41 of the bottom base 40 and a rubber seal 48 can be embedded into the trough 47. The rubber seal 48 contacts the end of the sidewall 302 of the top cover 30 to prevent gas from leaking out of the interior of the inner container through the gap between the top cover 30 and the bottom base 40.

Figure 9:
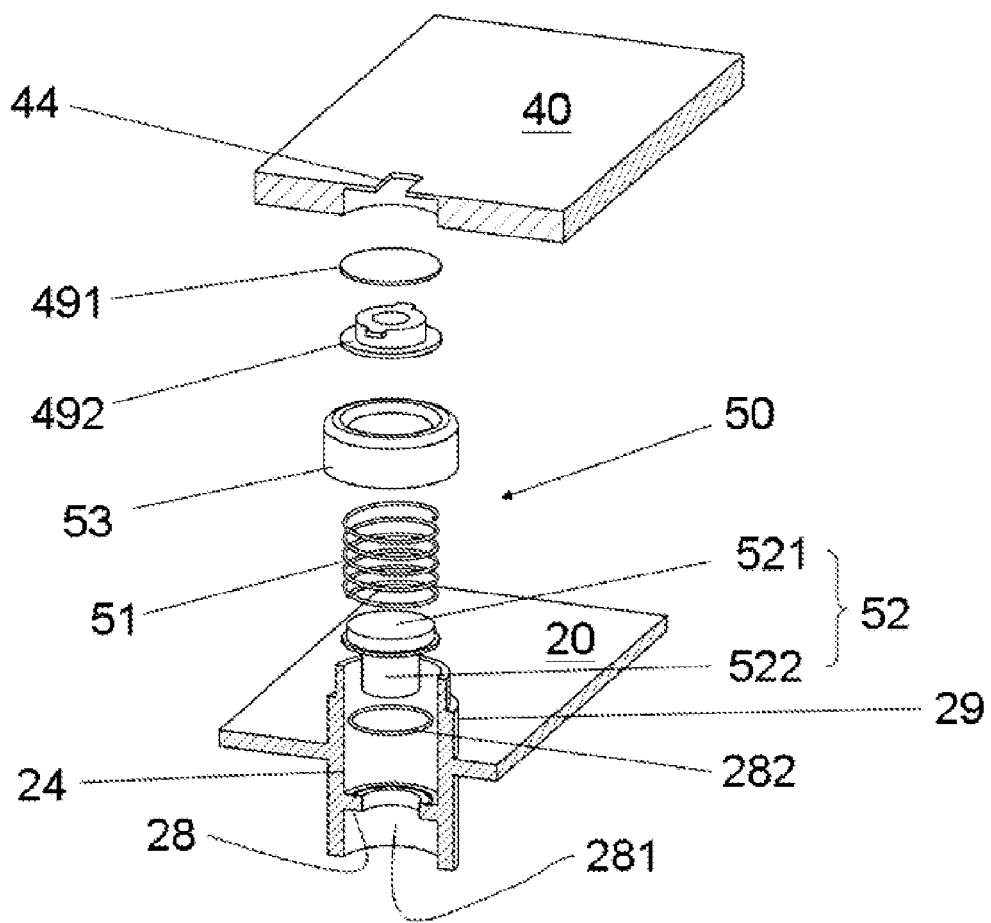
FIG. 9 is a view of the purging valve of the reticle storing container of the present invention.

Referring then to FIG. 9, which is a view of the purging valve of the reticle storing container of the present invention. The purging valve 50 is disposed in the first through-hole 24 of the container base 20. The first through-hole 24 includes a contact platform 28 that extends from its inner sidewall toward the center for an external passage 281 to form between the contact platform 28. The first through-hole 24 further extends toward the first inner space to form a flange 29. The purging valve 50 includes a spring 51, a valve part 52, and an elastic member 53. The valve part 52 includes a base 521 and a tube portion 522 protruding downward from the center of the base 521; when the valve part 52 is placed in the first through-hole 24, the tube portion 522 is placed in the external passage 281 between the contact platform 28, and the base 521 props against the contact platform 28. After the spring 51 is further placed on top of the base 521 of the valve part 52, with the elastic member 53 and the flange 29 being snap-fitted, the valve part 52 and the spring 51 are fastened between the contact platform 28 and the elastic member 53.

And a filter piece 491 can be further disposed in the second through-hole 44 of the bottom base 40. The filter piece 491 is fastened in a way similar to the way in which the filter piece 35 in the through-hole 32 of the top cover 30 is fastened; both the circumference of the second through-hole 44 and a fastening piece 492 used for fastening the filter piece 491 respectively include snap-fits, whereas the snap-fit of the fastening piece 492 is located above the snap-fit on the circumference of the second through-hole 44 for the fastening piece 492 and the second through-hole 44 to be snap-fitted together. Since the filter piece 491 is fastened in the second through-hole 44 of the bottom base 40, the gas purged by the purging head is to be filtered by the filter piece 491 before entering the inner container of the Then, referring to FIG. 7, which is a view of the container base 20 of the reticle storing container of the present invention. The container base 20 includes an inner surface 21, a side surface 22, and an outer surface 23, and contacts the platform 131 of the container base reception portion 13 of the container body 10 via its inner surface 21. A lock-fastening device (not shown in Figure) is disposed between the inner surface 21 and the outer surface 23 of the container base 20. The keyhole of the lock-fastening device is exposed on the outer surface 23; therefore, with a key being inserted into the keyhole and rotated, the lock-fastening device sticks out of the opening hole 221 of the side surface 22 and enters the recess 132 on the sidewall of the container body 10 for the container base 20 and the container body 10 to be enclosingly locked. And the lock-fastening device can also be alternatively designed as thus: when a key is inserted into the keyhole and rotated, the lock-fastening device returns from the recess 132 on the sidewall of the container body 10 or draws back into the interior of the container base 20 for the container base 20 and the container body 10 to be in openable status. Moreover, three rows of positioning devices with an included angle of 120 degrees between each other are disposed on the inner surface 21. Each row of positioning devices includes two positioning bolts 25 for fastening the bottom base 40 of the inner container to the container base 20. In a preferred embodiment, the number of positioning bolts 25 is a multiple of three (such as 3, 6, 9, etc.), which is not limited in the present invention. And as previously described, at least a first through-hole 24 is disposed on the container base 20; the first through-hole 24 connects the inner surface 21 and the outer surface 23 of the container base 20 and a purging valve 50 is disposed therein. reticle storing container for enhancing the cleanliness of gas in the container. And a trough (not shown in Figure) can be further disposed on the contact platform 28 and a seal ring 282 is disposed in the trough to prevent the gas in the interior from leaking through the gap between the valve part 52 and the contact platform 28 before the reticle storing container is purged.

Figure 7:
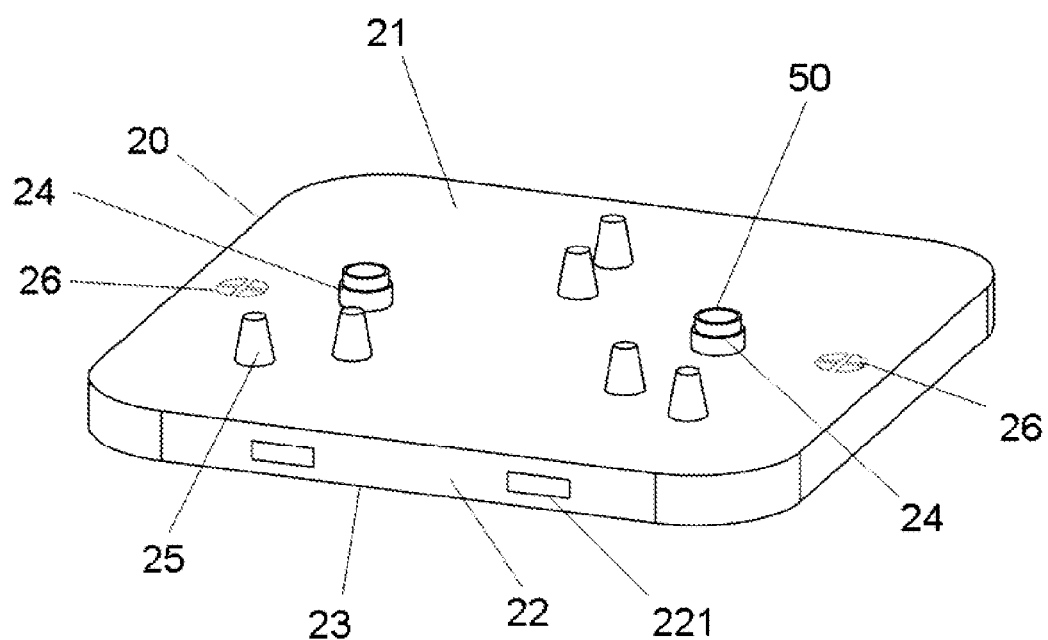
FIG. 7 is a view of the container base of the reticle storing container of the present invention.
Figure 10:
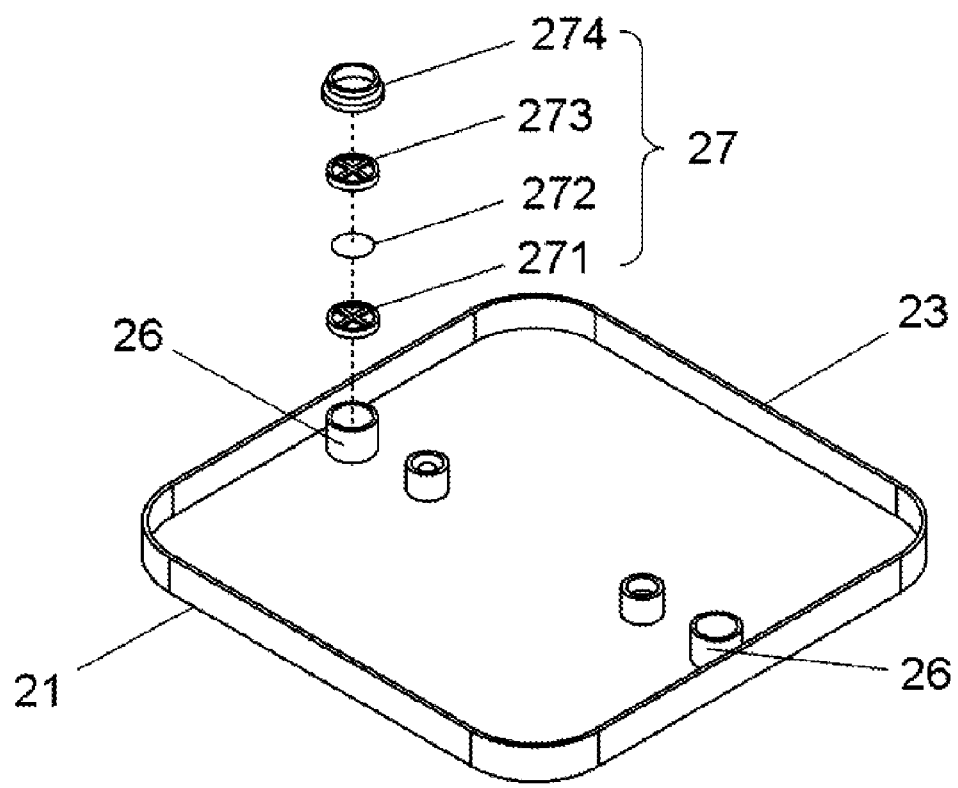
FIG. 10 is a view of the outer surface of the container base of the reticle storing container of the present invention.

And as shown in FIG. 7 and FIG. 10, an exhausting tube 26 extends from the inner surface 21 of the container base 20 in the direction of the outer surface 23, wherein the exhausting tube 26 can be further disposed with an exhausting valve 27. The exhausting valve 27 includes an upper filter piece supporter 271, a filter piece 272, a lower filter piece supporter 273, and a fastening piece 274; the upper filter piece supporter 271, the filter piece 272, and the lower filter piece supporter 273 are sequentially placed into the exhausting tube 26 and fastened in the exhausting tube 26 via the fastening piece 274. The aforementioned upper filter piece supporter 271, lower filter piece supporter 273, and fastening piece 274 all have pores that allow gas to pass through, and one end of the exhausting tube 26 is exposed on the outer surface 23 of the container base 20. Therefore, when the pressure of gas in the interior of reticle storing container is higher than the atmospheric pressure, surplus gas in the interior of reticle storing container can be exhausted through this exhausting device.

Figure 11:
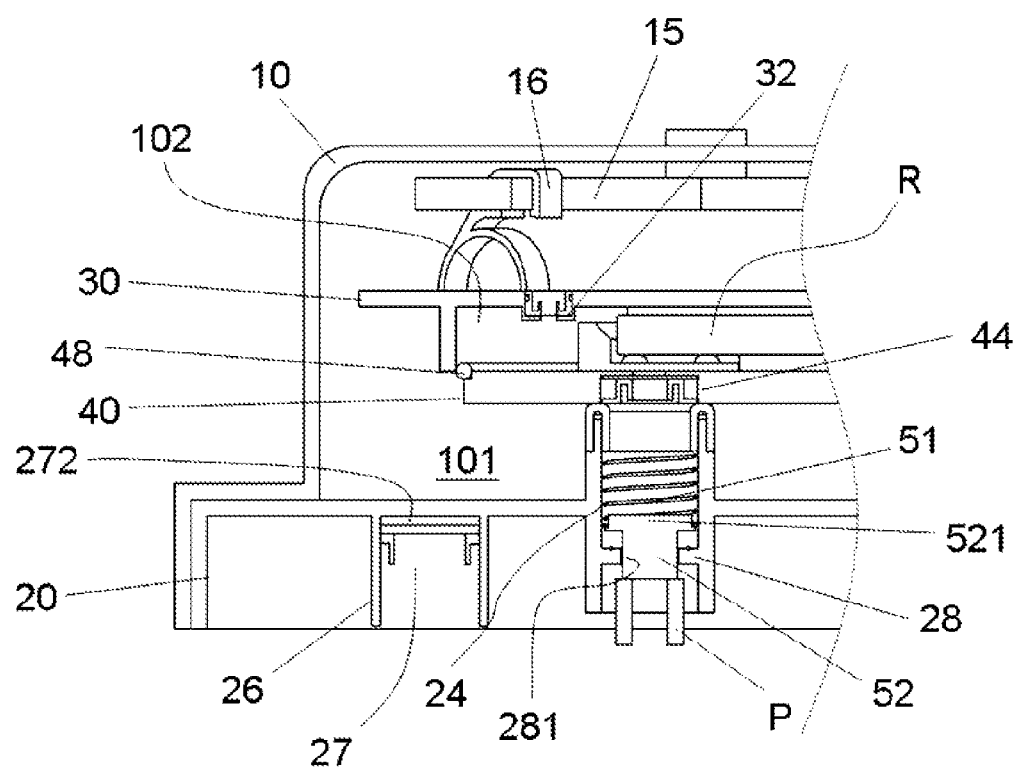
FIG. 11 is a view of the reticle storing container of the present invention in the process of being purged.

Then, referring to FIG. 11, which is a view of the reticle storing container of present invention in the process of being purged. When the valve part 52 of the purging valve 50 is sustained by the purging tube P of a purging head, the spring 51 on top of the valve part 52 is in the state of being compressed, and a gap occurs between the contact platform 28 and the base 521 of the valve part 52; therefore, gas purged by the purging head can enter the second inner space 102 through the first through-hole 24 and the second through-hole 44. Gas provided by the purging head is Extremely Clean Dry Air (XCDA), nitrogen, or an inert gas. When the purged gas enters the second inner space 102, gas that previously fills the space is exhausted from the through-hole 32 of the top cover 30 and the second inner space 102 is then in a state of cleanliness. With gas continuing to be purged by the purging head, the first inner space 101 is further filled in with XCDA, nitrogen, or an inert gas, and gas that is previously in the first inner space 101 is then exhausted from the exhausting valve 27 of the container base 20. And since the exhausting valve 27 includes the filter piece 272, cleanliness of the gas in the first inner space 101 can also be maintained at certain degree.

Figure 12:
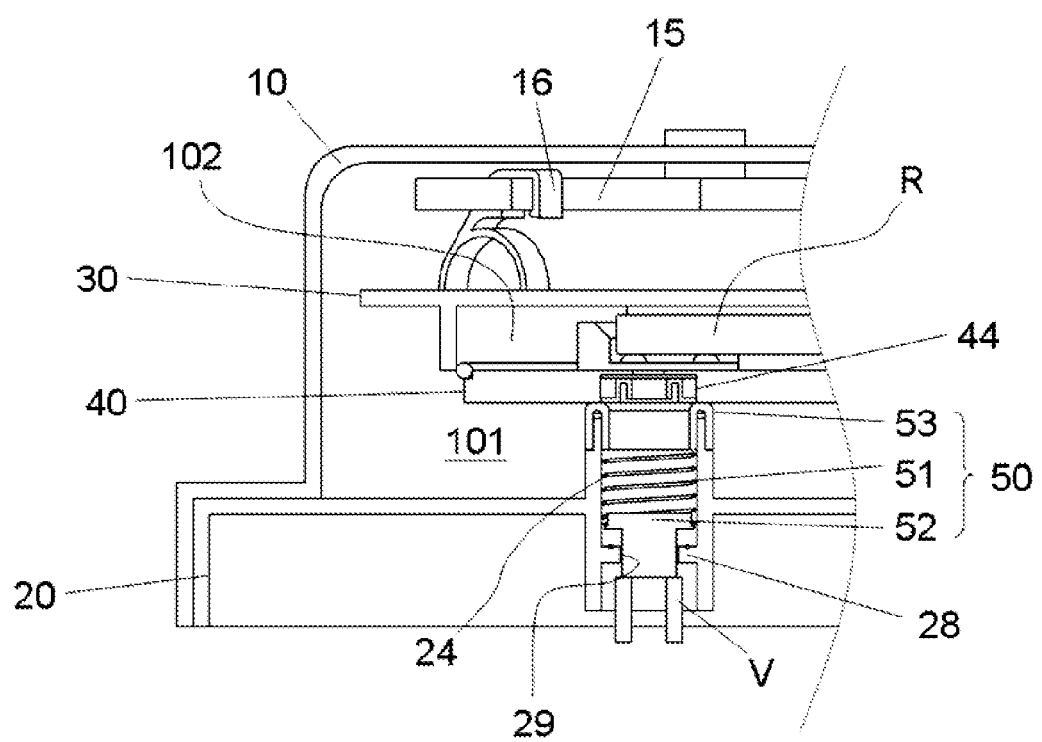
FIG. 12 is a view of another reticle storing container of the present invention in the process of being exhausted.

Then, referring to FIG. 12, which is a view of another reticle storing container of the present invention. The reticle storing container]comprises an outer container, an inner container, and a valve body 50. The outer container in the present embodiment is almost the same as the outer container in the previous embodiment and also comprises a container body 10, a container base 20, and a first inner space 101 formed between the container body 10 and the container base 20 for storing the inner container; the difference is in that the container base 20 of the present embodiment does not include the exhausting tube 26 and the exhausting valve 27 as shown in FIG. 11. The inner container in the present embodiment is almost the same as the inner container in the previous embodiment and also comprises a top cover 30, a bottom base 40, and a second inner space 102 formed between the top cover 30 and the bottom base 40 for storing a reticle R; the difference is in that the top cover 30 of the inner container of the present embodiment does not include the through-hole 32, the filter piece 35, and the fastening piece 36 as shown in FIG. 6. The valve body 50 of the present embodiment is the same as the purging valve 50 in the previous embodiment and comprises an elastic member 53, a spring 51, and a valve part 52, and the difference is in that the valve body 50 of the present embodiment is used for exhausting gas rather than purging.

When the valve part 52 is sustained by the vacuum tube V of a vacuum pump, the spring 51 on top of the valve part 52 is in the state of being compressed, and a gap occurs between the contact platform 28 and the base 521 of the valve part 52; therefore, the vacuum pump can further pump out the gas in the second inner space 102 for the second inner space 102 to be in a vacuum status to prevent the particles or contaminants previously existing in this space from adhering to the reticle R. And when the second inner space 102 is, or almost is, in a vacuum status, the vacuum tube V withdraws from the valve body 50; meantime, the spring 51 provides a spring force for the base 521 of the valve part 52 to press the contact platform 28, and thus the second inner space 102 continues to remain in a vacuum state. And since the contact platform 28 is disposed with a trough (not shown in Figure) and a seal ring 282 is embedded in the trough, gas outside the reticle storing container cannot enter the second inner space 102 through the gap between the contact platform 28 and the valve part 52.

Figure 13:
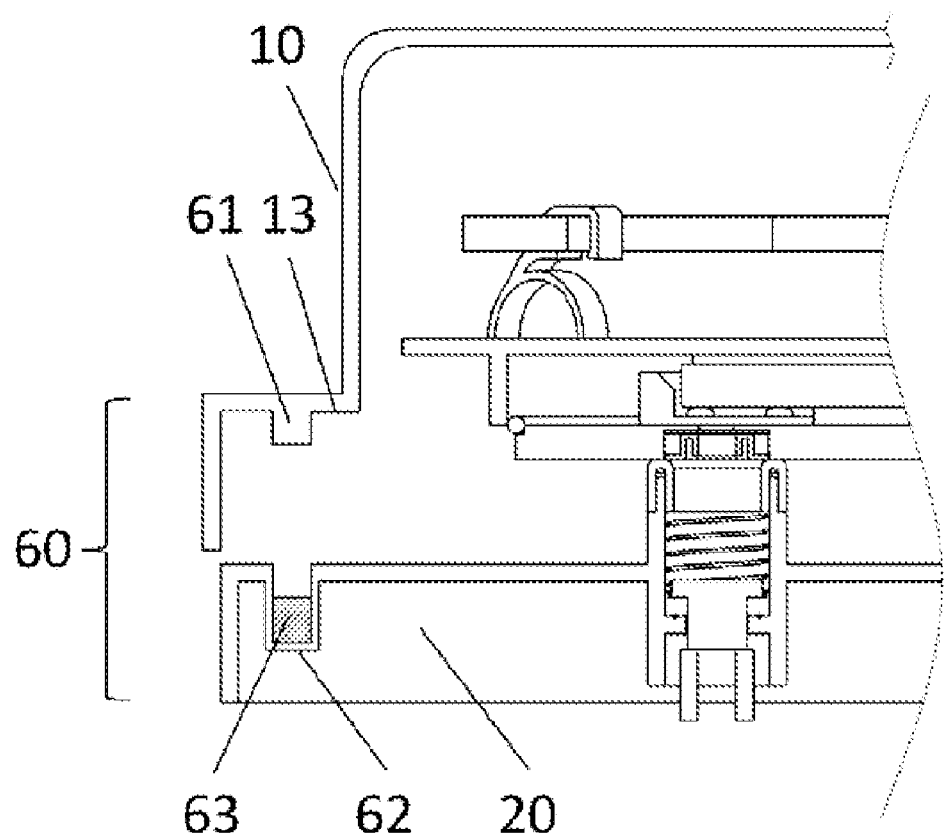
FIG. 13 is a magnified view of an embodiment of the sealing portion of the container body and the container base of the reticle storing container of the present invention.

Then, referring to FIG. 13, which is a magnified view of an embodiment of a first sealing portion of the container body and the container base of the reticle storing container of the present invention. As shown in FIG. 13, the container body 10 is an integrated structure, wherein a first protruding portion 61 is formed on the inner side of the shell surrounding the container body 10; a first concaving portion 62 is formed near the surrounding rim of the container base 20 and the first concaving portion 62 is opposite to the first protruding portion 61. When the container body 10 and the container base 20 of the reticle storing container are assembled, the first protruding portion 61 and the opposite concaving portion 62 are joined with each other. And in the present embodiment, a first filter material 63 is disposed in the first concaving portion 62, so when the first protruding portion 61 and the first concaving portion 62 are joined with each other, the first protruding portion 61 is in tight contact with the first filter material 63 in the first concaving portion 62 to form a sealing state for isolating the interior of the reticle storing container from the external atmosphere. What is to be particularly emphasized is that, in a preferred embodiment of the present invention, the material of the first filter material 63 is a porous material, for example, porous materials formed by ceramic material (glass fiber, PTFE, or magnetic fiber); however, the material used for forming the first filter material 63 is not limited in the present invention.

In the description of the present invention above, the interior of the reticle storing container will be vacuum pumped due to preservation requirements, for example, the second inner space 102 of the reticle storing container is vacuum pumped to a pressure of $10^{-1}$ torr; thus, the atmospheric pressure in the interior of the reticle storing container is much lower than that in the exterior, so that the external atmosphere may permeate into the interior of the reticle storing container through the first sealing portion 60 and spoil the cleanliness of the interior of the reticle storing container and further cause contamination of the reticle R. However, in the present embodiment, when the external atmosphere permeates into the interior of the reticle storing container through the first sealing portion 60, with the disposition of the first filter material 63, the atmosphere that permeates into the interior of the [reticle storing container needs to pass through the first filter material 63 halfway. As the first filter material 63 is a porous material, the permeating atmosphere will be filtered so that the contamination of the interior of the reticle storing container can be prevented.

Figure 14:
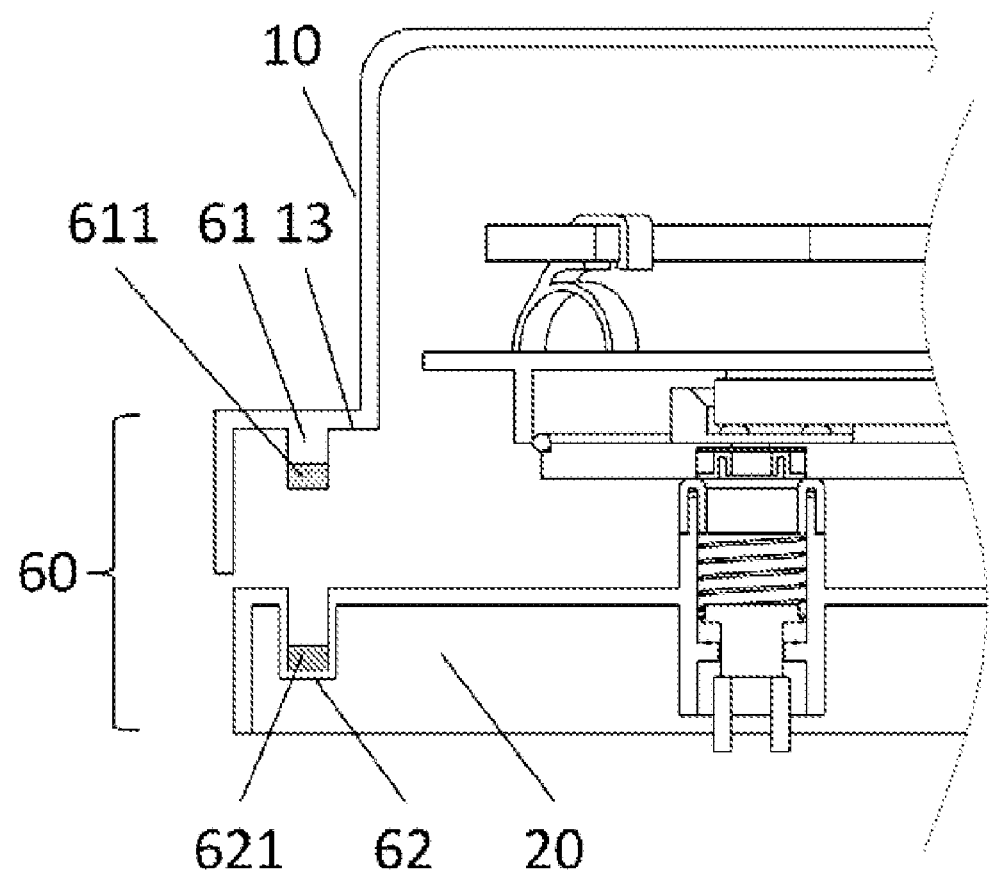
FIG. 14 is a magnified view of another embodiment of the sealing portion of the container body and the container base of the reticle storing container of the present invention.

Then, referring to FIG. 14, which is a magnified view of another embodiment of the first sealing portion of the container body and the container base of reticle storing container of the present invention. As shown in FIG. 14, the container body 10 is an integrated structure, wherein a first protruding portion 61 is formed on the inner side of the shell surrounding the container body 10; a first concaving portion 62 is formed near the surrounding rim of the container base 20 and the first concaving portion 62 is opposite to the first protruding portion 61 of the container body 10. When the container body 10 and the container base 20 of the reticle storing container are assembled, the first protruding portion 61 and the first concaving portion 62 are joined with each other. And in the present embodiment, a first magnetic component of outer container 611 and a second magnetic component of outer container 621 are respectively disposed on the first protruding portion 61 and the first concaving portion 62, the first magnetic component of outer container 611 and the second magnetic component of outer container 621 having opposite magnetic properties, i.e. N pole and S pole. Therefore, when the first protruding portion 61 and the first concaving portion 62 are joined with each other, by employing the mutual attraction of opposite magnetic poles, the first magnetic component of outer container 611 and the second magnetic component of outer container 612 attract each other for the first sealing portion to be tightly joined and for the sealing effect to be achieved.

Similarly, the interior of the reticle storing container will be vacuum pumped due to preservation requirements, for example, the second inner space 102 of the reticle storing container is vacuum pumped to a pressure of $10^{-1}$ torr; thus, the atmospheric pressure in the interior of the reticle storing container is much lower than that in the exterior, so that the external atmosphere may permeate into the interior of the reticle storing container through the first sealing portion 60 and spoil the cleanliness of the interior of the reticle storing container and further cause contamination of the reticle R. However, in the present embodiment, when the external atmosphere permeates into the interior of the reticle storing container through the first sealing portion 60, with the disposition of the first magnetic component of outer container 611 and the second magnetic component of outer container 621, the atmosphere that permeates into the interior of the reticle storing container needs to pass through the first magnetic component of outer container 611 and the second magnetic component of outer container 621 halfway. As metal particles and metal ions in the atmosphere will be attracted by the magnetic components at the same time, the permeating atmosphere is thus filtered so that the contamination of the interior of the reticle storing container can be prevented. Meantime, when the material of the container body 10 and the container base 20 of the present embodiment is metal, metal particles will be generated when the container body 10 and the container base 20 are assembled, and therefore the first magnetic component of outer container 611 and the second magnetic component of outer container 621 respectively disposed on the first protruding portion 61 and the first concaving portion 62 will attract the metal particles generated and prevent the interior from being contaminated.

In the description of the present invention above, when the material of the container body 10 and the container base 20 is metal, the metal material can be attracted by the first magnetic component of outer container 611 or the second magnetic component of outer container 621. Therefore, in still another embodiment of the present invention, it is not limited whether both the first protruding portion 61 and the first concaving portion 62 need to be disposed with the first magnetic component of outer container 611 or the second magnetic component of outer container 621, i.e. either the first protruding portion 61 of the container body 10 or the first concaving portion 62 of the container base 20 needs to be disposed with the first magnetic component of outer container 611 or the second magnetic component of outer container 621, since the aforementioned effect can be achieved by either way.

Figure 15A:
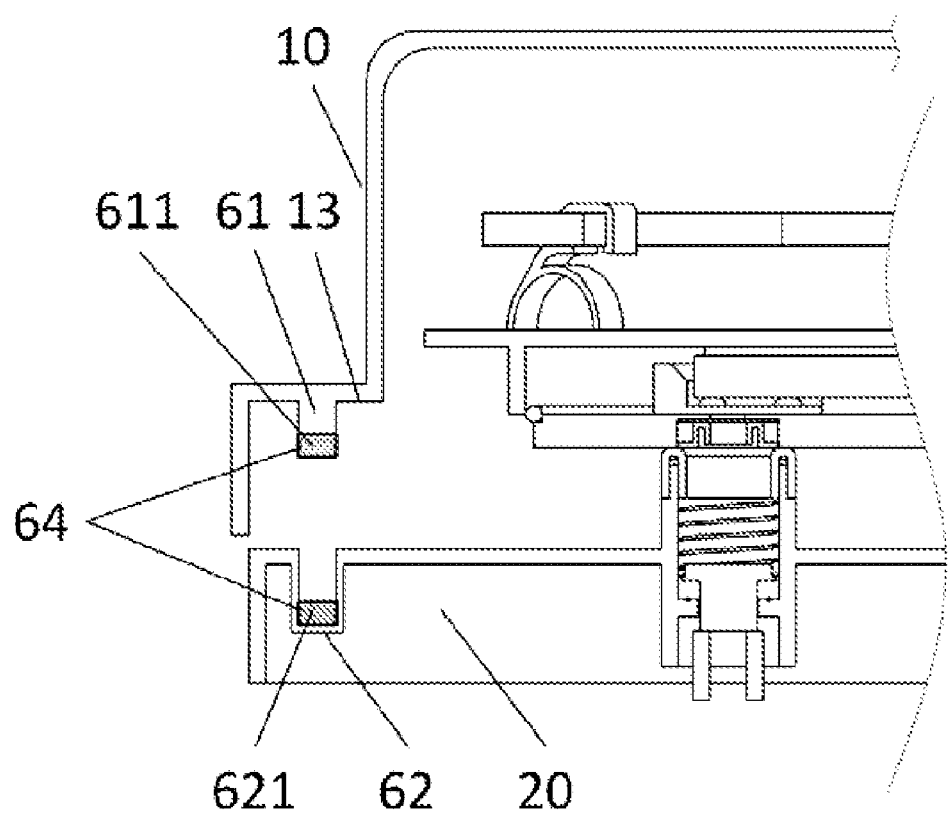
FIG. 15A is a view of an embodiment of the magnetic components of the present invention.
Figure 15B:
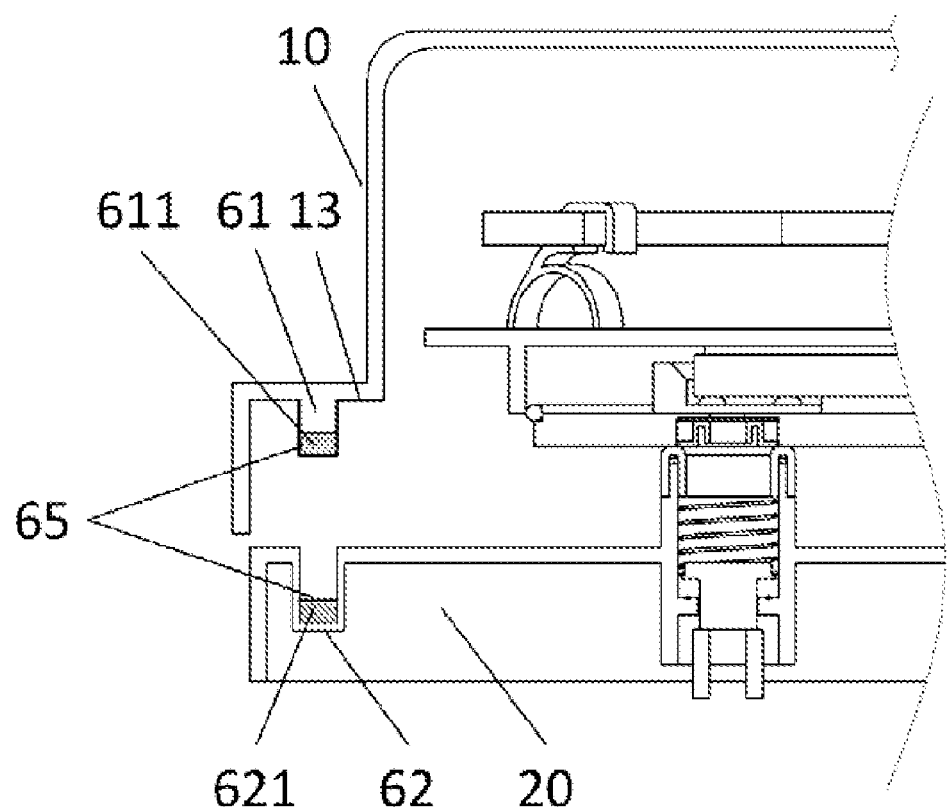
FIG. 15B is a view of another embodiment of the magnetic components of the present invention.

Referring then to FIG. 15A and FIG. 15B, which are views of another embodiment of the magnetic components of the present invention. Since the magnetic force of the first magnetic component of outer container 611 and the second magnetic component of outer container 621 is able to penetrate, i.e. to attract without making direct contact, the first magnetic component of outer container 611 and the second magnetic component of outer container 621 are, as shown in FIG. 15A, coated by a coating layer 64 formed by polymer material such as polyetherimide; however, the form of the coating layer 64 or the way of coating (coating the left and right sides or coating the top and bottom) are not limited in the present invention. The primary function of the coating layer 64 is to further enhance the sealing effect when the first protruding portion 61 in the container body 10 and the first concaving portion 62 on the container base 20 are tightly joined with each other, and the coating layer 64 also serves to protect the first magnetic component of outer container 611 and the second magnetic component of outer container 621 from being worn after contacting each other. Referring then to FIG. 15B, in addition to the disposition of the coating layer 64 for coating the magnetic components of outer container 611 and 621, the first magnetic component of outer container 611 and the second magnetic component of outer container 621 can be first disposed on the first protruding portion 61 and the first concaving portion 62 and then covered by a covering layer 65, wherein the material and function of the covering layer 65 are the same as those of the coating layer 64. Similarly, when the material of the container body 10 and the container base 20 is metal, the metal material can be attracted by the first magnetic component of outer container 611 or the second magnetic component of outer container 621. Therefore, in yet another embodiment of the present invention, it is not limited whether both the first protruding portion 61 and the first concaving portion 62 need to be disposed with the first magnetic component of outer container 611 or the second magnetic component of outer container 621, i.e. either the first protruding portion 61 of the container body 10 or the first concaving portion 62 of the container base 20 needs to be disposed with the first magnetic component of outer container 611 or the second magnetic component of outer container 621, and then the polymer material is further formed on the first magnetic component of outer container 611 or the second magnetic component of outer container 621, the aforementioned effect thus being achieved.

Figure 16A:
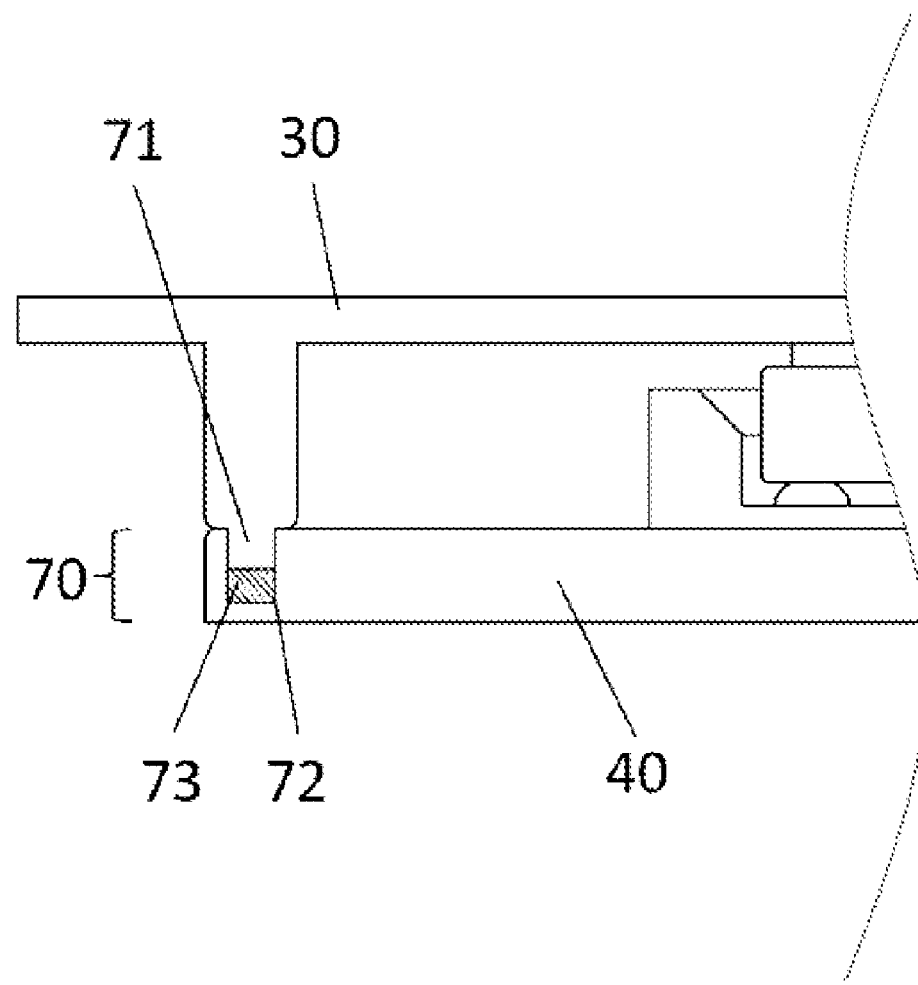
FIG. 16A is a magnified view of an embodiment of the sealing portion of the top cover and the bottom base of the reticle storing container of the present invention.
Figure 16B:
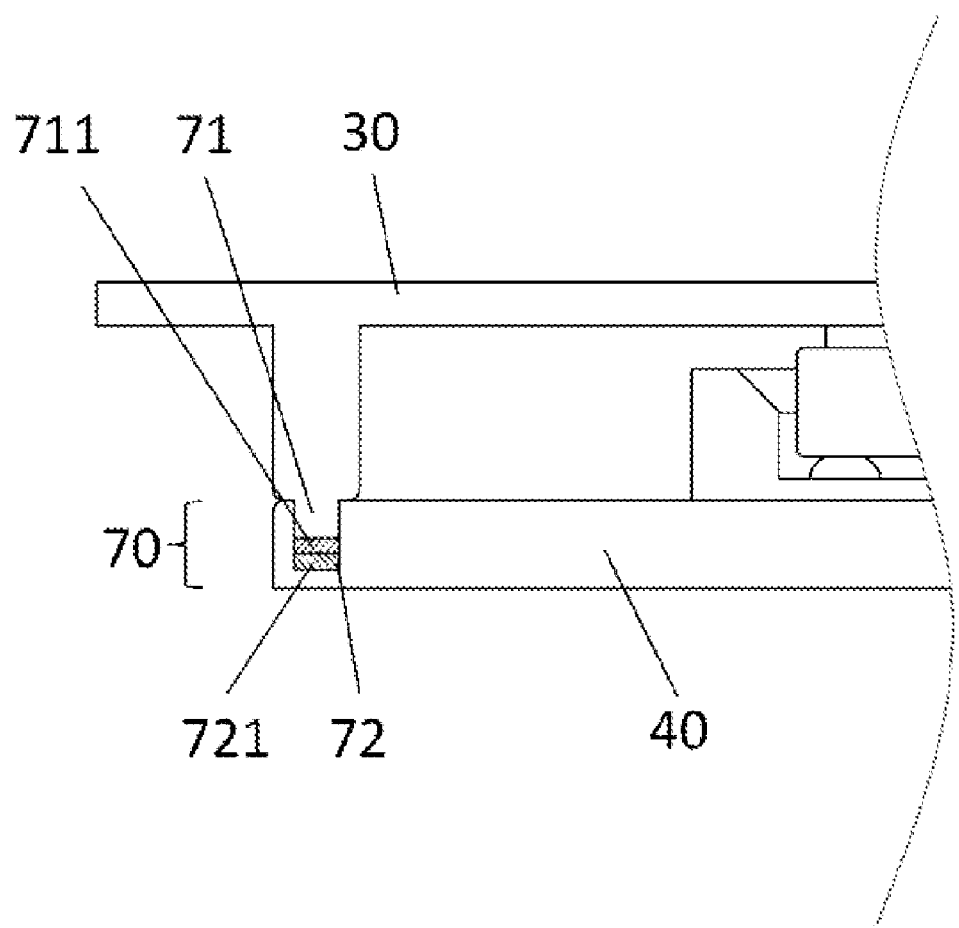
FIG. 16B is a magnified view of another embodiment of the sealing portion of the top cover and the bottom base of the reticle storing container of the present invention.
Figure 16C:
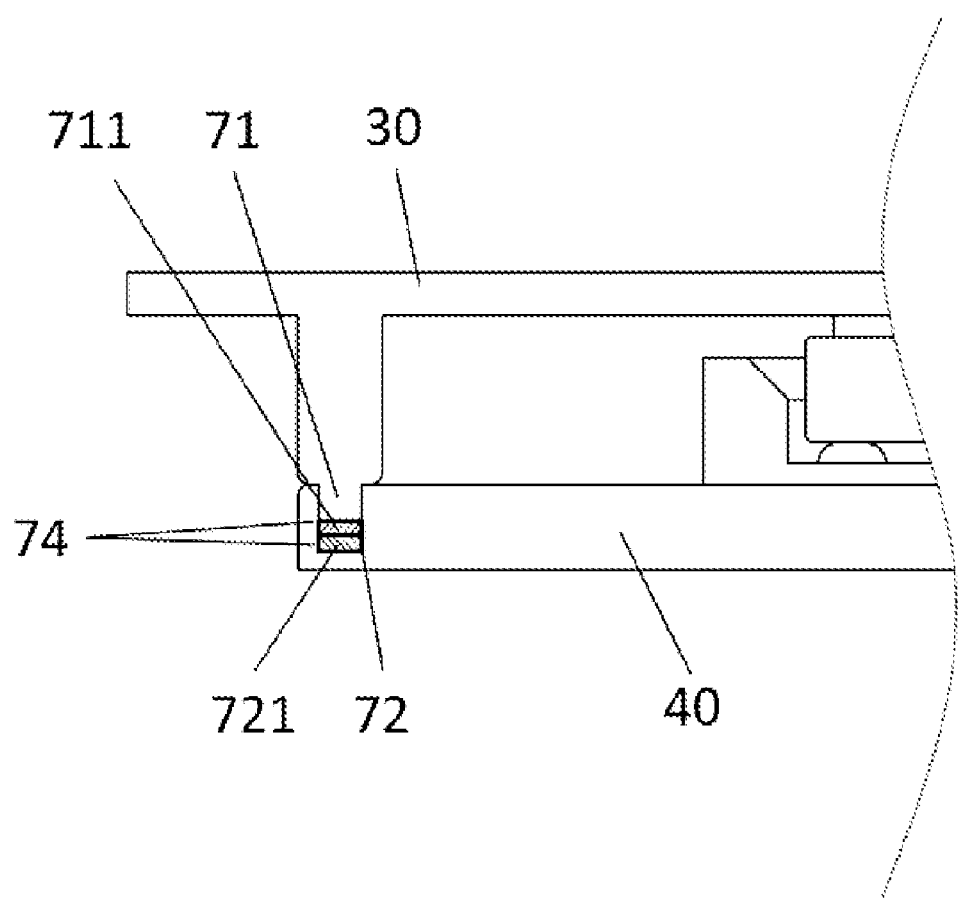
FIG. 16C is a view of an embodiment of the magnetic components of the inner container of the present invention.
Figure 16D:
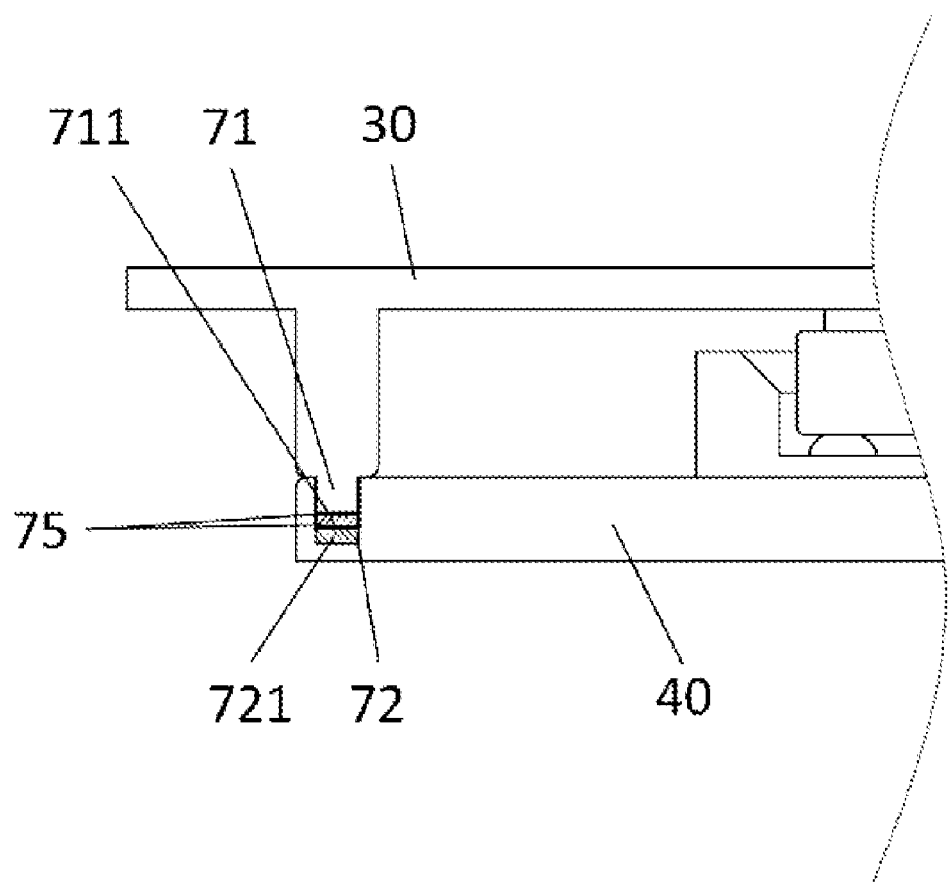
FIG. 16D is a view of another embodiment of the magnetic components of the inner container of the present invention.

Then, referring to FIG. 16A to FIG. 16D, which are magnified views of the sealing portion of the top cover and the bottom base of the reticle storing container of the present invention. Similar to the first sealing portion 60 formed by the container body 10 and the container base 20 of the outer container, the second sealing portion 70 formed by the top cover 30 and the bottom base 40 of the inner container is also disposed with a second protruding portion 71 and a second concaving portion 72 similar to what is described above; the second protruding portion 71 and the opposite second concaving portion 72 are joined with each other when the top cover 30 and the bottom base 40 of the inner container are assembled. And as shown in FIG. 16A, a second filter material 73 is disposed in the second concaving portion 72; as shown in FIG. 16B, a first magnetic component of inner container 711 is disposed on the second protruding portion 71 and a second magnetic component of inner container 721 is disposed on the second concaving portion 72; as shown in FIG. 16C, the first magnetic component of inner container 711 and the second magnetic component of inner container 721 are coated by a coating layer 74 formed by polymer material; as shown in FIG. 16D, the first magnetic component of inner container 711 and the second magnetic component of inner container 721 are first respectively disposed on the second protruding portion 71 and the second concaving portion 72 and then covered with a covering layer 75. The embodiment shown in FIGS. 16A to 16D are similar to the embodiments shown in FIGS. 13 to 15B, and the difference is in that the application is performed on the inner container rather than the outer container and the detailed description is thus omitted.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reticle storing container, comprising:
    an outer container, comprising a container body and a container base, a first inner space being formed between said container body and said container base, a first protruding portion being formed on inner side of shell of said container body, a first concaving portion opposite to said first protruding portion being formed on said container base, a first filter material being embedded into said first concaving portion to correspond to said first protruding portion, and at least a first through-hole being disposed on said container base;
    an inner container, being disposed in said first inner space of said outer container, said inner container comprising a top cover and a bottom base, a second inner space being formed between said top cover and said bottom base for storing a reticle, and at least a second through-hole connecting to said first through-hole being disposed on said bottom base; and
    a valve body, being disposed in said first through-hole of said bottom base and connected to said second through-hole of said inner container, wherein said valve body comprises a spring and a valve part, said valve part being propped up by a vacuum pump and thus compressing said spring for said valve body to be connected to said vacuum pump.

2. The container according to claim 1, wherein said inner container further comprises a second protruding portion disposed on inner side of said top cover of said inner container and a second concaving portion opposite to said second protruding portion disposed on said bottom base, a second filter material being further embedded into said second concaving portion to correspond to said second protruding portion.

3. The container according to claim 2, wherein said first filter material is a porous material.

4. The container according to claim 2, wherein said second filter material is a porous material.

5. The container according to claim 1, wherein material of said outer container is a metal material.

6. The container according to claim 5, wherein material of said inner container is a metal material.

7. The container according to claim 1, wherein material of said inner container is a metal material.

\* \* \* \* \*